(12) United States Patent
Suzuki et al.

(10) Patent No.: US 8,159,580 B2
(45) Date of Patent: Apr. 17, 2012

(54) SOLID-STATE IMAGING DEVICE AND IMAGING APPARATUS USING THE SAME

(75) Inventors: Satoshi Suzuki, Tokyo (JP); Yojiro Tezuka, Yokohama (JP); Naoki Ohkouchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 561 days.

(21) Appl. No.: 12/326,884

(22) Filed: Dec. 2, 2008

(65) Prior Publication Data

US 2009/0086063 A1    Apr. 2, 2009

Related U.S. Application Data

(63) Continuation of application No. PCT/JP2007/061251, filed on May 29, 2007.

(30) Foreign Application Priority Data

Jun. 3, 2006 (JP) .................................. 2006-155496

(51) Int. Cl.
*H04N 3/14* (2006.01)
*H04N 5/335* (2006.01)
(52) U.S. Cl. ................ 348/299; 348/294; 250/208.1
(58) Field of Classification Search .......... 348/294–310, 348/345–357; 250/208.1
See application file for complete search history.

(56) References Cited

U.S. PATENT DOCUMENTS

| 4,410,804 | A | 10/1983 | Stauffer |
| 6,091,793 | A | 7/2000 | Kamashita |
| 6,710,804 | B1 * | 3/2004 | Guidash ........................ 348/302 |
| 6,956,605 | B1 | 10/2005 | Hashimoto |
| 7,250,971 | B2 * | 7/2007 | Yamada et al. ............... 348/316 |
| 7,271,835 | B2 | 9/2007 | Iizuka et al. |
| 2002/0121652 | A1 * | 9/2002 | Yamasaki ..................... 257/222 |
| 2002/0186312 | A1 * | 12/2002 | Stark ............................. 348/302 |
| 2005/0128328 | A1 | 6/2005 | Kakumoto et al. |
| 2006/0071290 | A1 | 4/2006 | Rhodes |
| 2007/0131991 | A1 | 6/2007 | Sugawa |
| 2007/0145512 | A1 | 6/2007 | Rhodes |

(Continued)

FOREIGN PATENT DOCUMENTS

JP     58-024105 A     2/1983

(Continued)

OTHER PUBLICATIONS

Office Action issued May 24, 2011 in Japanese patent Application No. 2006-155496.

*Primary Examiner* — Anthony J Daniels
(74) *Attorney, Agent, or Firm* — Miles & Stockbridge P.C.

(57) ABSTRACT

Providing a solid-state imaging device having a degree of freedom capable of changing which of the pixels functions as a pixel having a photoelectric converter portion bisected in which direction. When a gate electrode 67 is high and a gate electrode 68 is high, photodiodes 31 through 34 are electrically connected each other. When the gate electrode 67 is high and the gate electrode 68 is low, photodiodes 31 and 32, and photodiodes 33 and 34 are electrically connected each other. On the other hand, photodiodes 31 and 33, and photodiodes 32 and 34 are electrically separated. When the gate electrode 67 is low and the gate electrode 68 is high, photodiodes 31 and 32, and photodiodes 33 and 34 are electrically separated. On the other hand, photodiodes 31 and 33, and photodiodes 32 and 34 are electrically connected with each other.

9 Claims, 10 Drawing Sheets

U.S. PATENT DOCUMENTS

| | | |
|---|---|---|
| 2007/0158713 A1 | 7/2007 | Ohkawa |
| 2009/0090841 A1 | 4/2009 | Kusaka |
| 2009/0140305 A1 | 6/2009 | Sugawa |
| 2009/0225210 A1 | 9/2009 | Sugawa |

FOREIGN PATENT DOCUMENTS

| | | |
|---|---|---|
| JP | 11-177076 A | 7/1999 |
| JP | 2000-059696 A | 2/2000 |
| JP | 2003-244712 A | 8/2003 |
| JP | 2004-111590 A | 4/2004 |
| JP | 2004-335882 A | 11/2004 |
| JP | 2005-176081 A | 6/2005 |
| WO | WO 2005/083790 A1 | 9/2005 |
| WO | WO 2006/025079 A1 | 3/2006 |

* cited by examiner

SOLID-STATE IMAGING DEVICE AND IMAGING APPARATUS USING THE SAME

CROSS-REFERENCE TO RELATED APPLICATION

This application is a continuation of International Patent Application No. PCT/JP2007/061251 filed May 29, 2007.

TECHNICAL FIELD

The present invention relates to a solid-state imaging device and an imaging apparatus using the solid-state imaging device.

BACKGROUND ART

Recently, an imaging apparatus such as a video camera and an electronic still camera has widely spread. In each of these cameras, a solid-state imaging device such as a CCD type and an amplification type is used. In such a solid-state imaging device, a plurality of pixels having a photoelectric converter portion for generating a signal charge in accordance with an amount of incident light are formed in a grid shape.

In an amplification type solid-state imaging device, a signal charge generated and accumulated by the photoelectric converter portion in a pixel is led to an amplifying portion, and a signal amplified by the amplifying portion is output from the pixel.

In an amplification type solid-state imaging device, there is proposed, for example, a solid-state imaging device using a junction-field-effect-transistor in the amplifying portion in Japanese Patent Application Laid-Open Nos. 11-177076 and 2004-335882, and a CMOS type solid-state imaging device using an MOS transistor in the amplifying portion in Japanese Patent Application Laid-Open No. 2004-111590.

In the conventional solid-state imaging devices disclosed in the above-described patent documents, a photoelectric converter portion, an amplifying portion, and a charge-storing portion for temporally storing the charge between them are disposed in each pixel. Moreover, in the conventional solid-state imaging devices, after exposing all pixels at the same time, the signal charge generated in each photoelectric converter portion is transferred to each charge-storing portion at the same time over all pixels and temporally stored, and the signal charge is successively converted into pixel signal with a prescribed readout timing. Accordingly, it becomes possible to prevent image deformation caused by difference in exposure time of respective pixels between lines upon carrying out electronic shutter movement, which is a so-called rolling shutter.

In an imaging apparatus such as a camera, in order to realize automatic focusing control, it is necessary to detect a focusing state of an image-taking lens. Previously, a focal point detector was provided separately from a solid-state imaging device. However, in this case, cost increased and the apparatus became large by just the amount of the focal point detecting device and the focal point detecting optical system.

Accordingly, there has been proposed a solid-state imaging device configured to be used as a focal point detector with using a so-called pupil division phase difference detection method (sometimes called as a pupil division method or a phase difference method) as a focal point detection method (for example, Japanese Patent Application Laid-Open No. 2003-244712). The pupil division phase difference detection method is a method for detecting a defocusing amount of an image-taking lens such that a bundle of rays passing through the image-taking lens is divided into two at pupil to form a pair of divided images, and difference in the images (the amount of phase shift) is detected.

In the solid-state imaging device disclosed in Japanese Patent Application Laid-Open No. 2003-244712, a plurality of pixels having photoelectric converter portions bisected top and bottom (bisected into a top portion and a bottom portion) and a plurality of pixels having photoelectric converter portions bisected right and left (bisected into a right portion and a left portion) are provided. A micro-lens is provided on such photoelectric converter portions with one-to-one correspondence to each pixel. The bisected photoelectric converter portion is disposed substantially an imaging relation (conjugate relation) to the exit pupil of the image-taking lens by the micro-lens. Accordingly, since the distance between the exit pupil of the image-taking lens and the micro-lens is sufficiently larger than the dimension of the micro-lens, the bisected photoelectric converter portion is to be disposed substantially to the focal point of the micro-lens. In the relation described above, in each pixel, one of the bisected photoelectric converter portion selectively detects a bundle of rays passing through an area, which is a portion of the exit pupil of the image-taking lens, decentered in a given direction from the center of the exit pupil, and carries out photoelectric conversion. Moreover, in each pixel, the other of the bisected photoelectric converter portion selectively detects a bundle of rays passing through an area, which is a portion of the exit pupil of the image-taking lens, decentered in the opposite direction from the center of the exit pupil, and carries out photoelectric conversion.

In the solid-state imaging device disclosed in Japanese Patent Application Laid-Open No. 2003-244712, upon focal point detection, a signal from one of the bisected photoelectric converter portion of each pixel having the upper-and-lower (or right-and-left) bisected photoelectric converter portion and a signal from the other of the bisected photoelectric converter portion are transferred to a floating diffusion with different timings, and red out separately. In accordance with a theory of the pupil division phase difference detection method, a state of focusing of the image-taking lens is detected on the basis of these signals. On the other hand, upon taking picture after focusing of the image-taking lens, signals from both of the bisected photoelectric converter portions are transferred to the floating diffusion at the same timing, and added in the pixel to be red out. Accordingly, since the pixel having the bisected photoelectric converter portion does not cause the same state as a defective pixel, it is excellent in view of enhancing imaging performance.

In the solid-state imaging device disclosed in Japanese Patent Application Laid-Open No. 2003-244712, upon focal point detection, the reason that a plurality of pixels having an upper-and-lower bisected photoelectric converter portion and a plurality of pixels having a right-and-left bisected photoelectric converter portion are disposed is for precisely detecting a state of focusing in all directions by changing direction of pupil division so as to precisely detect phase shift amounts of mutually different directions. When signals from a plurality of pixels having upper-and-lower bisected photoelectric converter portion and disposed in an upper-and-lower direction are used, a phase shift amount in the upper-and-lower direction can be precisely detected. On the other hand, when signals from a plurality of pixels having right-and-left bisected photoelectric converter portion and disposed in a right-and-left direction are used, a phase shift amount in the right-and-left direction can be precisely detected.

However, in the solid-state imaging device disclosed in Japanese Patent Application Laid-Open No. 2003-244712, whether which pixel has an upper-and-lower bisected photoelectric converter portion and which pixel has a right-and-left bisected photoelectric converter portion are determined in advance, so that it is impossible to change the condition. Accordingly, for example, in order to enhance detection accuracy of focusing state, arrangement of pixels having an upper-and-lower bisected photoelectric converter portion and pixels having a right-and-left bisected photoelectric converter portion cannot be changed to an optimum arrangement in accordance with an object to be photographed, so that detection accuracy of focusing state cannot always be sufficiently enhanced.

DISCLOSURE OF THE INVENTION

The present invention is made in view of the above-described problems and has an object to provide a solid-state imaging device having a degree of freedom capable of changing which of the pixels functions as a pixel having a photoelectric converter portion bisected in which direction without causing the similar state of a defect pixel, and capable of enhancing detection accuracy of focus adjusting state, and an imaging apparatus using thereof.

According to a first aspect of the present invention, there is provided a solid-state imaging device for photoelectrically converting an object image formed by an image-taking lens comprising: a plurality of pixels disposed two-dimensionally; at least a portion of pixels among the plurality of pixels including four photoelectric converter portions each of which exists in one of four areas divided by a first direction dividing line and a second direction dividing line crossing with each other in plan view and carries out photoelectric conversion and a mode setting member capable of selectively setting in each of a first through a third modes in accordance with a control signal. In the solid-state imaging device, the first mode is a mode that signals from two photoelectric converter portions locating in one side of the first direction dividing line among the four photoelectric converter portions are added, and signals from two photoelectric converter portions locating in the other side of the first direction dividing line among the four photoelectric converter portions are added, and both of the added signals are obtained independently. The second mode is a mode that signals from two photoelectric converter portions locating in one side of the second direction dividing line among the four photoelectric converter portions are added, and signals from two photoelectric converter portions locating in the other side of the second direction dividing line among the four photoelectric converter portions are added, and both of the added signals are obtained independently. The third mode is a mode that signals from the four photoelectric converter portions are added.

According to a second aspect of the present invention, there is provided a solid-state imaging device for photoelectrically converting an object image formed by an image-taking lens comprising: a plurality of pixels disposed two-dimensionally; at least a portion of pixels among the plurality of pixels including four photoelectric converter portions each of which exists in one of four areas divided by a first direction dividing line and a second direction dividing line crossing with each other in plan view and carries out photoelectric conversion and a mode setting member capable of selectively setting in each of a first through a third modes in accordance with a control signal. In the solid-state imaging device, the first mode is a mode that two photoelectric converter portions locating in one side of the first direction dividing line among the four photoelectric converter portions are electrically connected, and two photoelectric converter portions locating in the other side of the first direction dividing line among the four photoelectric converter portions are electrically connected, and photoelectric converter portions located different side with respect to the first dividing line among the four photoelectric converter portions are electrically separated. The second mode is a mode that two photoelectric converter portions locating in one side of the second direction dividing line among the four photoelectric converter portions are electrically connected, and two photoelectric converter portions locating in the other side of the second direction dividing line among the four photoelectric converter portions are electrically connected, and photoelectric converter portions located different side with respect to the second dividing line among the four photoelectric converter portions are electrically separated. The third mode is a mode that two photoelectric converter portions locating in one side of the first direction dividing line among the four photoelectric converter portions, and two photoelectric converter portions locating in the other side of the first direction dividing line among the four photoelectric converter portions are electrically connected, and two photoelectric converter portions locating in one side of the second direction dividing line among the four photoelectric converter portions, and two photoelectric converter portions locating in the other side of the second direction dividing line among the four photoelectric converter portions are electrically connected.

In the second aspect of the present invention, it is preferable that a space between each of the two photoelectric converter portions among the four photoelectric converter portions adjacent each other with respect to the first or the second dividing line has a photoelectric converter function when the two electric converter portions are electrically connected, and does not have a photoelectric converter function when the two electric converter portions are electrically separated.

In the second aspect of the present invention, it is preferable that the mode setting member includes a first gate electrode disposed along the first dividing line and a second gate electrode disposed along the second dividing line.

In the second aspect of the present invention, it is preferable that the first gate electrode constitutes a gate of an MOS transistor setting semiconductor areas of the two photoelectric converter portions locating one side of the second dividing line among the four photoelectric converter portions to be source or drain, and a gate of an MOS transistor setting semiconductor areas of the two photoelectric converter portions locating the other side of the second dividing line among the four photoelectric converter portions to be source or drain, and the second gate electrode constitutes a gate of an MOS transistor setting semiconductor areas of the two photoelectric converter portions locating one side of the first dividing line among the four photoelectric converter portions to be source or drain, and a gate of an MOS transistor setting semiconductor areas of the two photoelectric converter portions locating the other side of the first dividing line among the four photoelectric converter portions to be source or drain.

In the second aspect of the present invention, it is preferable that the first and the second gate electrodes are constructed by a transparent material.

In the second aspect of the present invention, it is preferable that the first and the second gate electrodes are constructed by polysilicon.

In the second aspect of the present invention, it is preferable that the at least one portion of pixels include a first and a second electric charge storage portions for storing electric charge transferred from two respective photoelectric converter portions locating diagonally among the four photoelectric converter portions, an amplifier for outputting signal in accordance with an electric charge amount of a given portion, a first transfer gate for transferring electric charge from one side of photoelectric converter portion among the two photoelectric converter portions locating diagonally to the first electric charge storage portion, a second transfer gate for transferring electric charge from the other side of photoelectric converter portion among the two photoelectric converter portions locating diagonally to the second electric charge storage portion, a third transfer gate for transferring electric charge from the first transfer gate to the given portion, and a fourth transfer gate for transferring electric charge from the second transfer gate to the given portion.

In the second aspect of the present invention, it is preferable that the at least a portion of pixels includes an electric charge discharging gate for discharging electric charge from at least one photoelectric converter portion of the four photoelectric converter portions.

In the second aspect of the present invention, it is preferable that a micro-lens for leading light to the four photoelectric converter portions is provided to each of at least a portion of pixels with one-to-one correspondence.

According to a third aspect of the present invention, there is provided an imaging apparatus including the solid-state imaging device according to a first aspect or a second aspect, and a signal processor for outputting detection signal indicating focusing state of the image-taking lens on the basis of signals obtained in the first mode or the second mode from each of selected pixels among at least one portion of pixels.

In the third aspect of the present invention, it is preferable that whether on which mode among the first and the second modes detection of focus adjusting state of the image-taking lens is based is determined in accordance with the object.

In the third aspect of the present invention, it is preferable that a lens controller for controlling focus adjustment of the image-taking lens on the basis of the detection signal from the signal processor is included.

According to the present invention, it becomes possible to provide a solid-state imaging device having a degree of freedom capable of changing whether which pixel is functioned as a pixel having a photoelectric converter portion bisected in which direction without causing the similar state of a defect pixel, and capable of thereby enhancing detection accuracy of focus adjusting state, and an imaging apparatus using thereof.

THE BEST MODE FOR CARRYING OUT THE INVENTION

A solid-state imaging device and an imaging apparatus using the same according to the present invention are explained below with reference to accompanying drawings.

Figure 1:
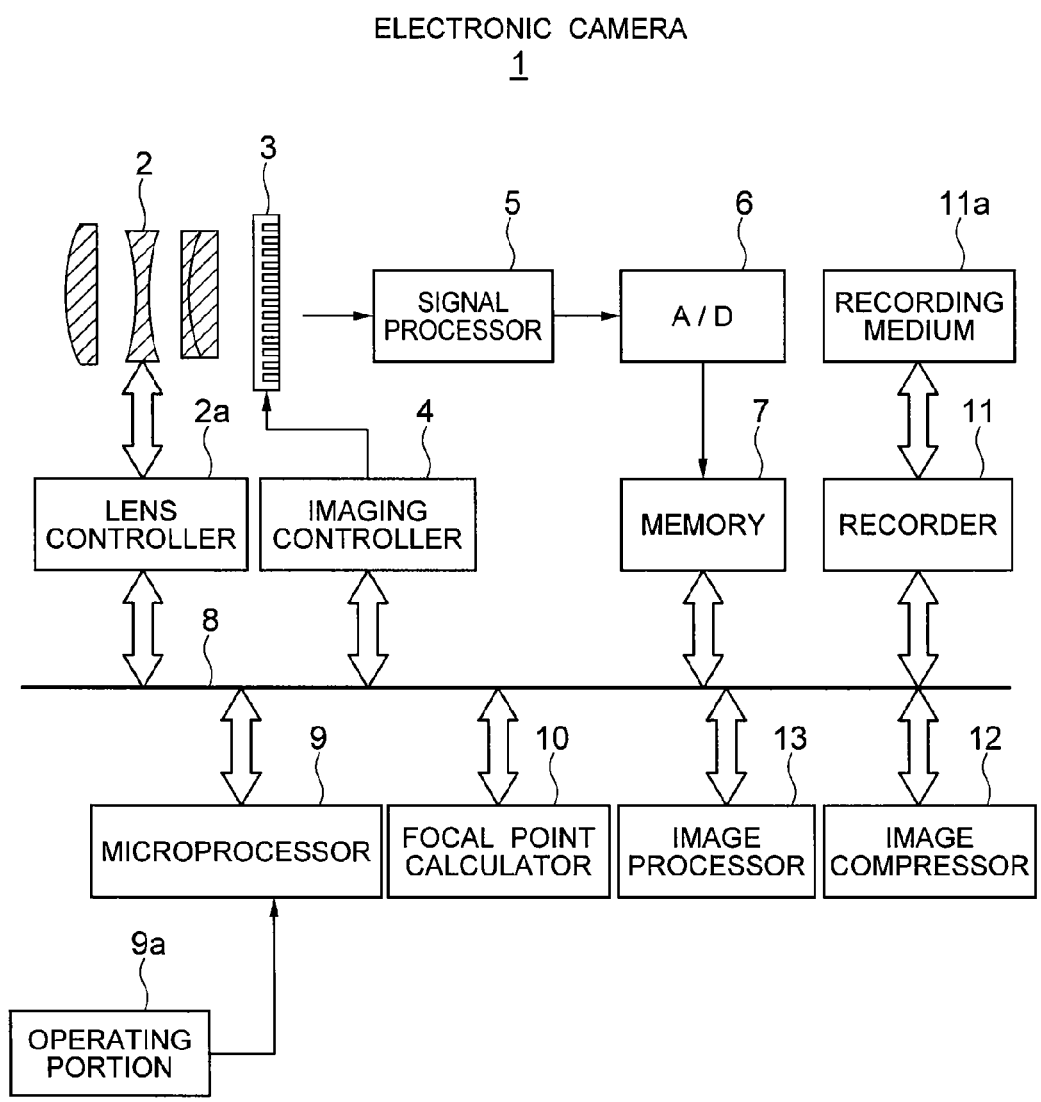
FIG. 1 is a block diagram showing an electronic camera according to an embodiment of the present invention.

FIG. 1 is a block diagram showing an electronic camera 1 as an imaging apparatus according to an embodiment of the present invention. The electronic camera 1 is equipped with an image-taking lens 2. The image-taking lens 2 is controlled by a lens controller 2a upon focusing and stopping down of an aperture stop. An imaging surface of a solid-state imaging device 3 is disposed in the image side space of the image-taking lens 2.

The solid-state imaging device 3 is driven by an instruction of an imaging controller 4 and outputs a signal. The signal output from the solid-state imaging device 3 is either an imaging signal or a focal point detection signal. Either way a signal is processed by a signal processor 5 and an A/D converter 6, and stored temporarily in a memory 7. The memory 7 is connected to a data bus 8. The data bus 8 is connected with the lens controller 2a, the imaging controller 4, a microprocessor 9, a focal point calculator (detection processor) 10, a recorder 11, an image compressor 12, and an image processor 13. The microprocessor 9 is connected with an operating portion 9a such as a release button. The recorder 11 is removably connected with a recording medium 11a. Movement of the electronic camera 1 is going to be explained later with reference to FIG. 12.

Figure 2:
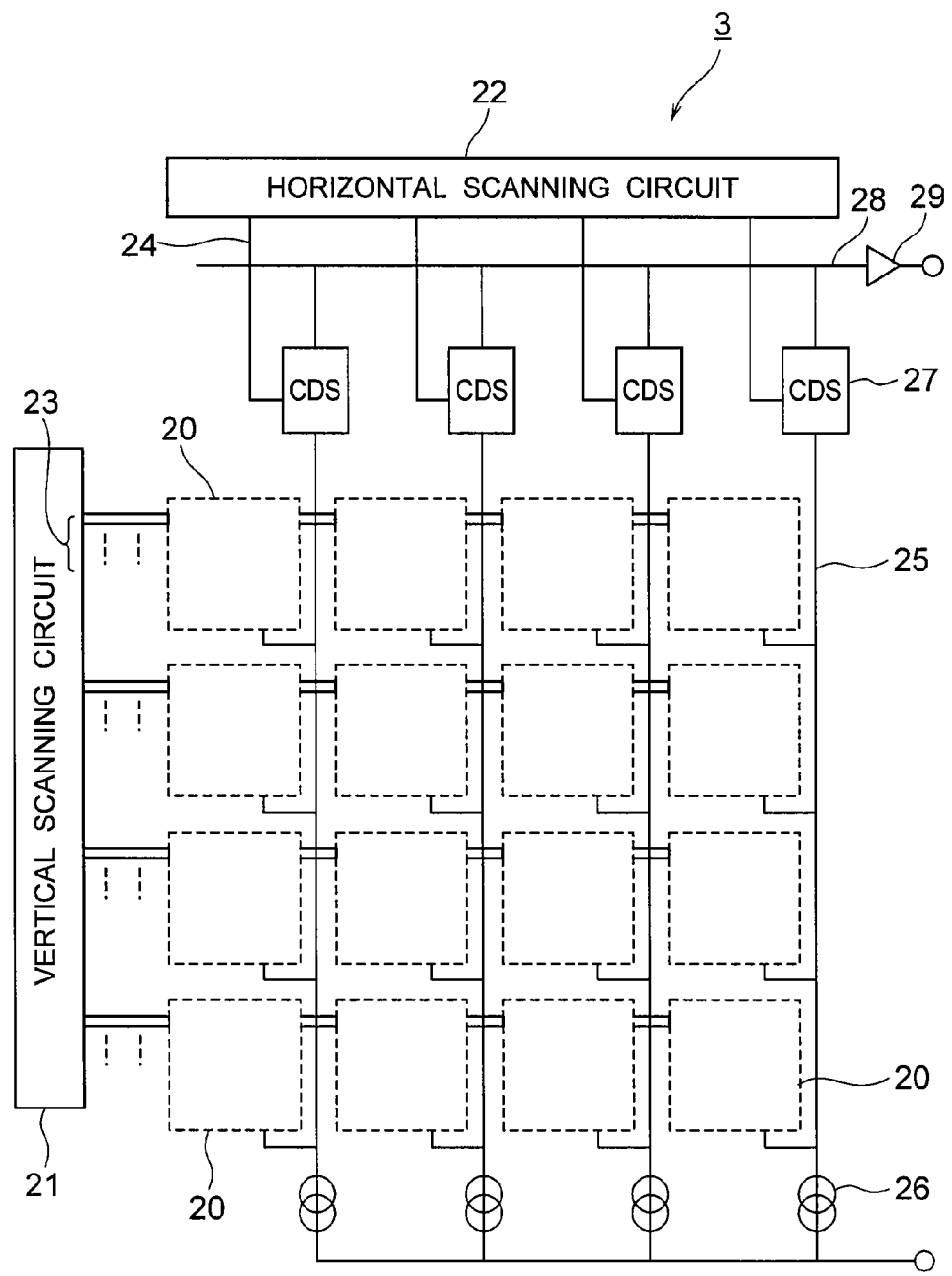
FIG. 2 is a circuit diagram showing broad configuration of a solid-state imaging device shown in FIG. 1.

FIG. 2 is a circuit diagram showing broad configuration of a solid-state imaging device 3 shown in FIG. 1. The solid-state imaging device 3 has a plurality of pixels 20 formed in a grid shape and peripheral circuitry for outputting a signal from the pixel 20. In FIG. 2, the number of pixels is 16 that is four rows horizontally and four columns vertically. However, the present invention is not limited to this. Although dotted line denoted by 20 shows an outline of a pixel, specific configuration and circuitry of the pixel are explained later.

In the present embodiment, with the exception of dummy or optical black, which does not perform photoelectric conversion (in other words, in the area of so-called effective pixels), each pixel 20 has the same circuitry and plane structure. The pixel 20 outputs either an imaging signal or a focal point detection signal in accordance with a drive signal from peripheral circuitry. Moreover, the whole pixels can be reset their photoelectric converter portions at the same time, so that exposure time and timing thereof can be made the same.

Peripheral circuitry is composed of a vertical scanning circuit 21, a horizontal scanning circuit 22, drive signal lines 23 and 24 connected thereto, a vertical signal line 25 for receiving signals from pixels, a constant-current power supply 26 for connecting to the vertical signal line 25, a correlation double sampling circuit (CDS) 27, a horizontal signal line 28 for receiving signal output from the correlation double sampling circuit 27, an output amplifier 29, and the like.

The vertical scanning circuit 21 and the horizontal scanning circuit 22 output a driving signal on the basis of an instruction from the imaging controller 4 of the electronic camera 1. Each pixel receives the driving signal output from the vertical scanning circuit 21 through the drive signal line 23, and is driven, and outputs the imaging signal or the focal point detection signal to the vertical signal line 25. The vertical scanning circuit 21 outputs a plurality of drive signals. Accordingly, a plurality of drive signal lines 23 are there. This is explained later.

The signal output from the pixel 20 is carried out predetermined noise reduction by the correlation double sampling circuit 27, and output in accordance with driving signal from the horizontal scanning circuit 22 through the horizontal signal line 28 and the output amplifier 29.

Figure 3:
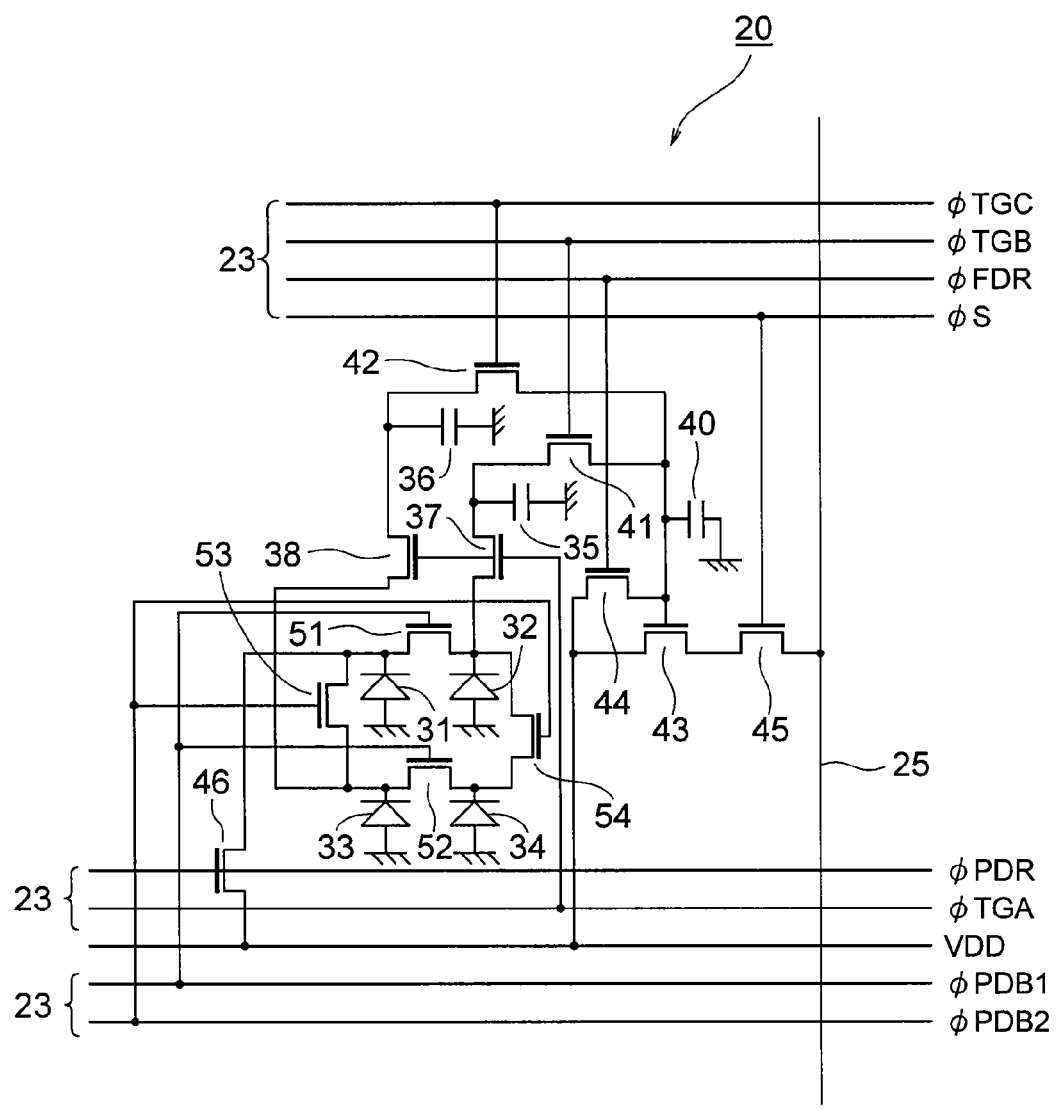
FIG. 3 is a circuit diagram showing a pixel shown in FIG. 2.

FIG. 3 is a circuit diagram showing a pixel 20 shown in FIG. 2. The pixel 20 includes four pinned photodiodes 31 through 34 as four photoelectric converter portions for generating and storing electric charge, a first and a second electric charge storage portions 35, 36 for separately storing electric charge transferred from the two pinned photodiodes 32, 33 locating diagonally, a first and a second transfer transistors 37, 38 as a first and a second transfer portions for transferring electric charge from pinned photodiodes 32, 33 to the first and the second electric charge storage portions 35, 36 respectively, a floating diffusion (FD) 40 as a designated portion, a third and a fourth transfer transistors 37, 38 as a third and a fourth transfer gate portions for transferring electric charge from the first and the second electric charge storage portions 35, 36 to the FD40 respectively, an amplifying transistor 43 as an amplifying portion for outputting signal in accordance with the amount of electric charge of FD 40, an FD reset transistor 44 as a first reset portion for discharging electric charge of the FD40, a select transistor 45 as a select switch for outputting signal from the pixel 20 through the amplifying transistor 43, and a PD reset transistor 46 as a second reset portion (an electric charge discharging portion) for discharging electric charge (disused electric charge generated by the pinned photodiodes 31 through 34) from the pinned photodiode 31.

Moreover, the pixel 20 includes a connection/separation transistor 51 for electrically connecting and separating pinned photodiodes 31 and 32, a connection/separation transistor 52 for electrically connecting and separating pinned photodiodes 33, 34, a connection/separation transistor 53 for electrically connecting and separating pinned photodiodes 31, 33, and a connection/separation transistor 54 for electrically connecting and separating pinned photodiodes 32, 34.

The first through fourth transfer transistors 37, 38, 41 and 42, the amplifying transistor 43, FD reset transistor 44, the select transistor 45, PD reset transistor 46, connection/separation transistors 51 through 54 are constructed by MOS transistors. In the present embodiment, these transistors except amplifying transistor 43 become on when the gate electrode is high, and off when the gate electrode is low.

Gate electrodes of connection/separation transistors 51, 52 are mutually connected, and mutually connected to every pixel row, and drive signal (control signal) φPDB1 is provided from the vertical scanning circuit 21 through drive signal line 23. Gate electrodes of connection/separation transistors 53, 54 are mutually connected, and mutually connected to every pixel row, and drive signal (control signal) φPDB2 is provided from the vertical scanning circuit 21 through drive signal line 23.

In the present embodiment, when φPDB1 is high and φPDB2 is low, connection/separation transistors 51, 52 become on and connection/separation transistors 53, 54 become off, so that pinned photodiodes 31, 32 are electrically connected, and pinned photodiodes 33, 34 are electrically connected, on the other hand, pinned photodiodes 31, 33 are electrically separated, and pinned photodiodes 32, 34 are electrically separated. As a result, pinned photodiodes 31 through 34 as a whole become substantially equivalent to an upper-and-lower bisected (bisected into an upper portion and a lower portion) photoelectric converter portion. In the following explanation, this state is called as a PD upper-and-lower bisected state.

When φPDB1 is low and φPDB2 is high, connection/separation transistors 51, 52 become off and connection/separation transistors 53, 54 become on, so that pinned photodiodes 31, 32 are electrically separated, and pinned photodiodes 33, 34 are electrically separated, on the other hand, pinned photodiodes 31, 33 are electrically connected, and pinned photodiodes 32, 34 are electrically connected. As a result, pinned photodiodes 31 through 34 as a whole become substantially equivalent to a left-and-right bisected (bisected into a left portion and a right portion) photoelectric converter portion. In the following explanation, this state is called as a PD left-and-right bisected state.

When φPDB1 is high and φPDB2 is high, connection/separation transistors 51 through 54 become on, so that pinned photodiodes 31, 32 are electrically connected, pinned photodiodes 33, 34 are electrically connected, pinned photodiodes 31, 33 are electrically connected, and pinned photodiodes 32, 34 are electrically connected. As a result, pinned photodiodes 31 through 34 as a whole become substantially equivalent to an undivided photoelectric converter portion. In the following explanation, this state is called as a PD undivided state.

In the present embodiment, the first and the second electric charge storage portions 35, 36 are provided, and electric charge generated in the pinned photodiodes 31 through 34 is temporarily stored in the first and the second electric charge storage portions 35, 36 before transferring to FD40. Accordingly, it becomes possible to make exposure time and timing thereof regarding the all pixels the same, so that not only synchronism of the image signal can be secured, but also synchronism of the signal upon focal point detection can be secured. However, the present invention is not limited to this, and it may be constructed to carry out rolling shutter without providing electric charge storage portions 35, 36.

The first transfer transistor 37 transfers electric charge from the pinned photodiode 32 to the first electric charge storage portion 35. The place where the electric charge is generated differs under which state the exposure is took place such as the PD upper-and-lower bisected state, the PD left-and-right bisected state, or the PD undivided state. The second transfer transistor 38 transfers electric charge from the pinned photodiode 33 to the second electric charge storage portion 36. The place where the electric charge is generated also differs under which state the exposure is took place such as the PD upper-and-lower bisected state, the PD left-and-right bisected state, or the PD undivided state.

Gate electrodes of the first and the second transfer transistors 37, 38 are mutually connected, and mutually connected to every pixel row, and drive signal φTGA is provided from the vertical scanning circuit 21 through drive signal line 23. The first and the second transfer transistors 37, 38 become on at the same time with a given timing in accordance with the drive signal φTGA, and electric charge is transferred from the two pinned photodiodes 32, 33 to the electric charge storage portions 35, 36 at the same time respectively. However, the present invention is not limited to this, for example, it may be possible to separately provide drive signal to each gate electrode so as to make the first and the second transfer transistor 37, 38 in the on state at the same time.

On the other hand, the third and the fourth transfer transistors 41, 42 are separately provided drive signals. Gate electrode of the third transfer transistor 41 is mutually connected every pixel row and drive signal φTGB is provided from the vertical scanning circuit 21 through drive signal line 23. Gate electrode of the fourth transfer transistor 41 is mutually connected every pixel row, and drive signal φTGC is provided from the vertical scanning circuit 21 through drive signal line 23. The third and the fourth transfer transistors 41, 42 become on state with a given timing in accordance with these drive signals φTGB and φTGC, and transfer electric charge from the first and the second electric charge storage portions 35, 36 to the FD40 with separate timings or at the same timing.

Gate electrode of the select transistor 45 is mutually connected every pixel row, and drive signal φS is provided from the vertical scanning circuit 21 through drive signal line 23. Gate electrode of the FD reset transistor 44 is mutually connected every pixel row, and drive signal φFDR is provided from the vertical scanning circuit 21 through drive signal line 23. Gate electrode of the PD reset transistor 46 is mutually connected every pixel row, and drive signal φPDR is provided from the vertical scanning circuit 21 through drive signal line 23.

In the present embodiment, all of the effective pixels have the same structure, and these pixels can output either focal point detection signal or image signal. However, the present invention is not limited to this, and a focal point detection area may be provided to a given position of the solid-state imaging device 3, and pixels for outputting focal point detection signal may be disposed in the area.

In FIG. 3, one terminal of pinned photodiodes 31 through 34, one terminal of electric charge storage portions 35, 36, and one terminal of the FD40 are expediently shown to be grounded. However, as will be understood from FIGS. 5 through 8 explained later, they become electric potentials of P-well 62.

Figure 4:
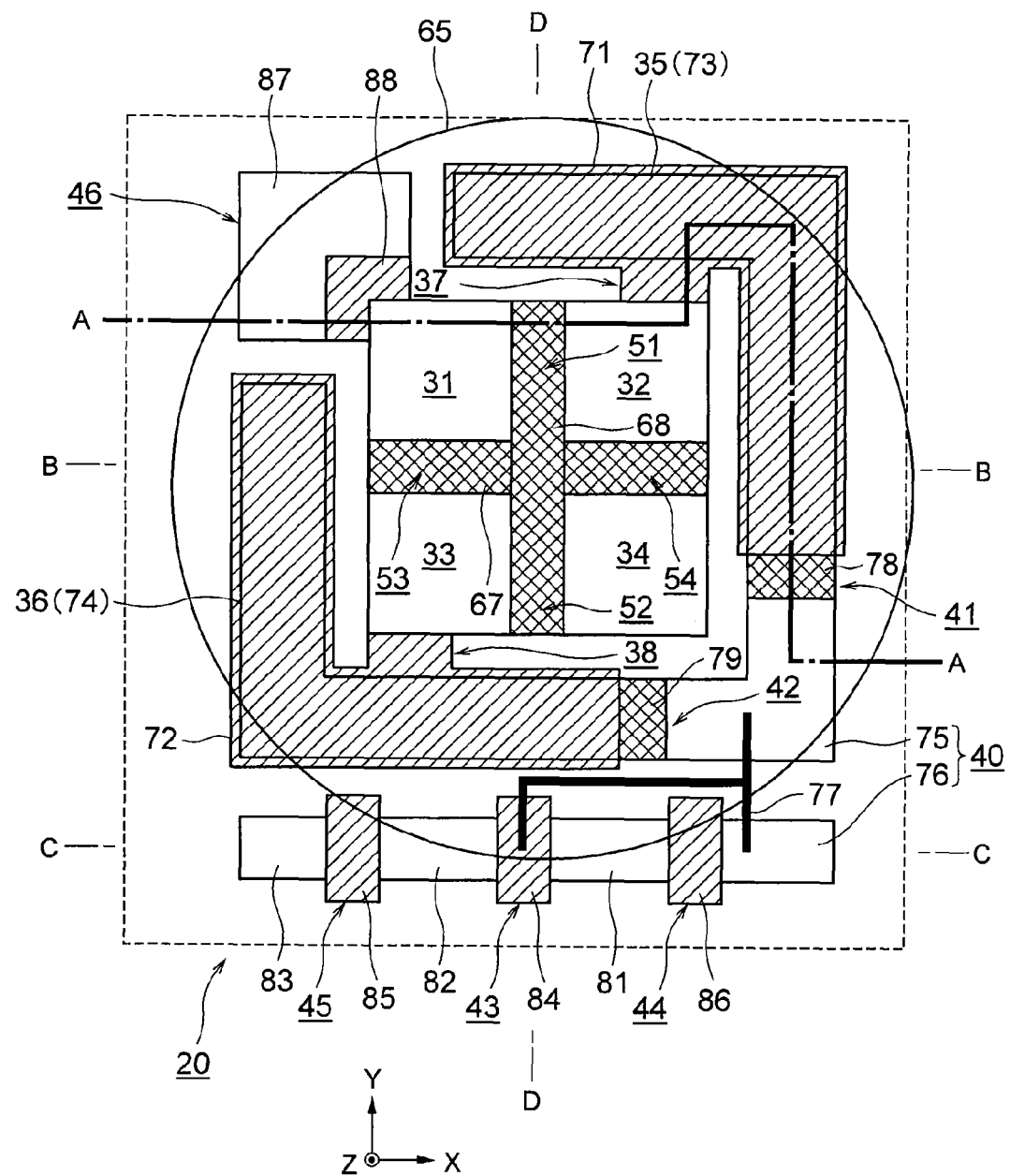
FIG. 4 is a plan view typically showing the pixel shown in FIG. 2.
Figure 5:
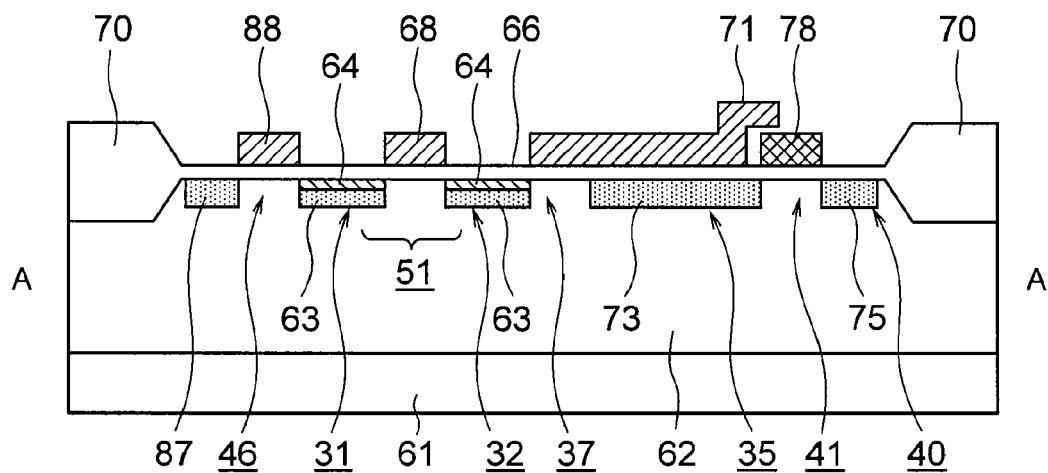
FIG. 5 is a sectional view along A-A line in FIG. 4 showing a predetermined movement state.
Figure 6:
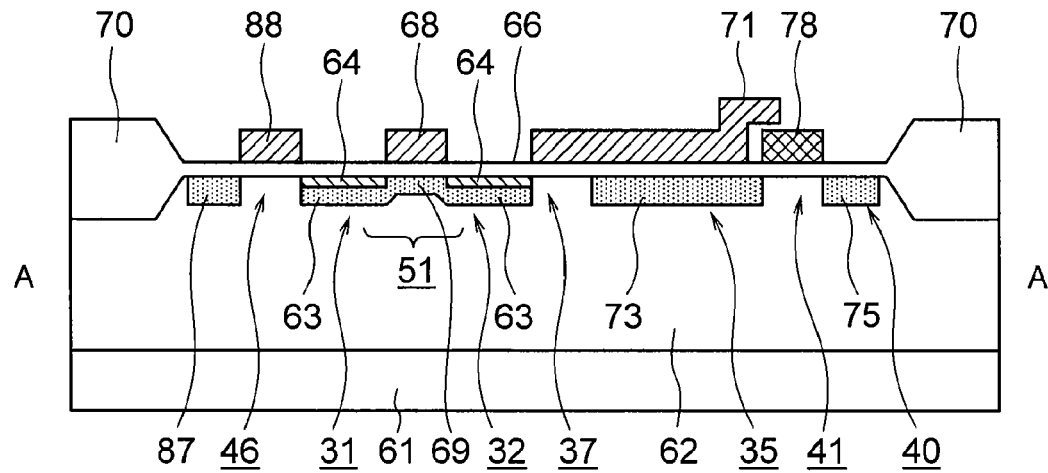
FIG. 6 is a sectional view along A-A line in FIG. 4 showing another movement state.
Figure 7:
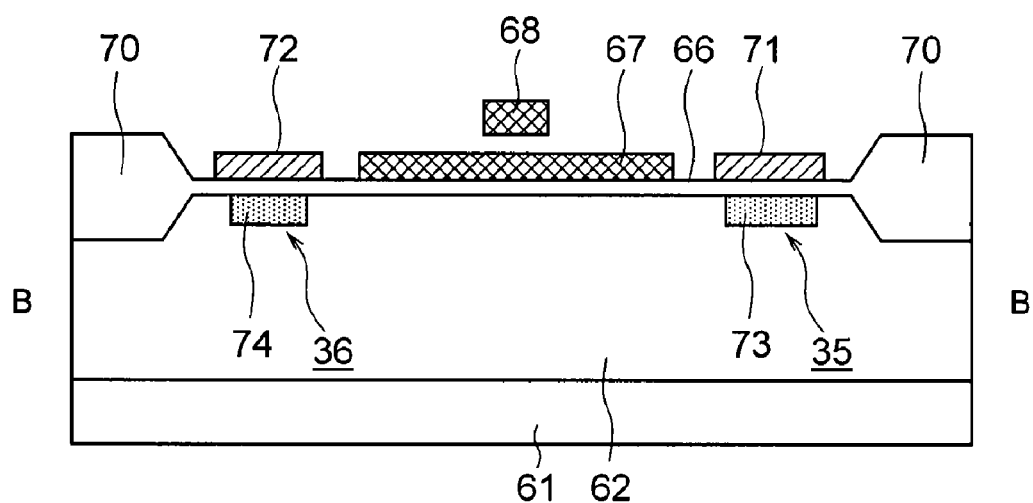
FIG. 7 is a sectional view along B-B line in FIG. 4.
Figure 8:
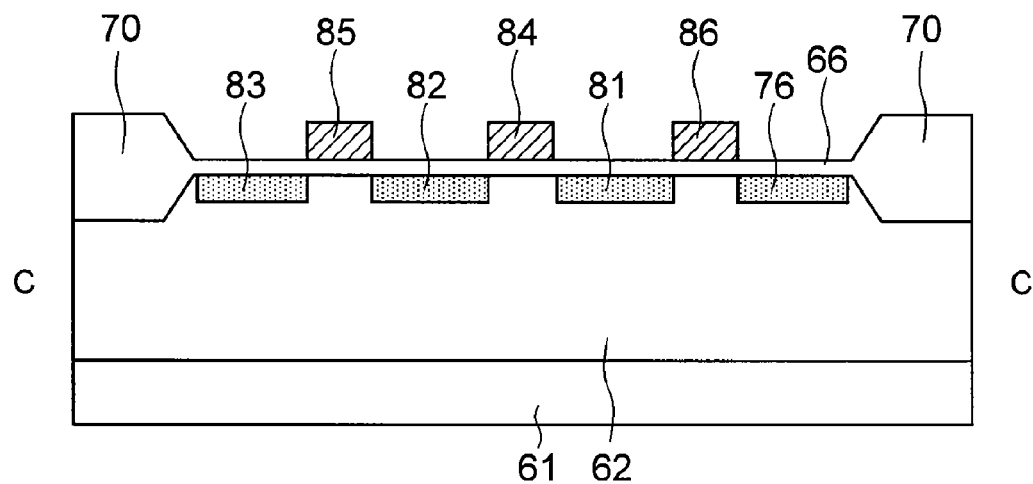
FIG. 8 is a sectional view along C-C line in FIG. 4.

FIG. 4 is a plan view typically showing the pixel shown in FIG. 2. FIGS. 5 and 6 are sectional views along A-A line in FIG. 4. FIG. 5 shows a state where the second gate electrode is low (in other words, φPDB2 is low), and the connection/separation transistor 51 is made to be off. FIG. 7 is a sectional view along B-B line in FIG. 4. FIG. 8 is a sectional view along C-C line in FIG. 4. In FIGS. 5 through 8, the micro-lens is omitted. In FIGS. 4 through 8, drive lines are omitted, except electrical connection of lines in the pixel 20.

For the sake of simplicity, mutually orthogonal X axis, Y axis, and Z axis are defined as shown in FIG. 4. The surface of the substrate 61 is regarded as parallel to the XY surface. In X direction, the arrow is called as +X direction, and the opposite direction is called as −X direction, and the same goes for the Y direction. In the present specification, X direction is the right-and-left direction, +X direction is the right side, −X direction is the left side, Y direction is the upper-and-lower direction, +Y direction is the upper side, and −Y direction is the lower side.

As shown in FIGS. 5 through 8, a P-type well 62 is formed on an N-type silicon substrate 61. An N-type charge storage layer 63 is formed on the P-type well 62, and by adding a P-type depletion prevention layer 64 on the surface side of the charge storage layer 63 pinned photodiodes 31 through 34 are composed. Here, although the construction of a pinned photodiode is adopted, the present invention is not limited to this, and the depletion prevention layer may be omitted.

As shown in FIG. 4, the four pinned photodiodes 31 through 34 are disposed in four areas divided by a division line B-B in Y direction and a division line D-D in X direction each crossing in a plane seen from Z direction. The pinned photodiode 31 is disposed in the upper left area, the pinned photodiode 32 is in the upper right area, the pinned photodiode 33 is in the lower left area, and the pinned photodiode 34 is in the lower right area among the four areas. These pinned photodiodes 31 through 34 are disposed near to the intersection of the division lines B-B and D-D, and disposed rotationally symmetric around the intersection. As shown in FIG. 4, a micro-lens 65 for leading incident light to the pinned photodiodes 31 through 34 is disposed. The micro-lens is disposed such that the centerline thereof passes through the intersection of the division lines B-B and D-D. Accordingly, incident light led by the micro-lens 65 is divided at the pupil and led to each pinned photodiodes 31 through 34. In order to lower the shading effect, for example, the micro-lens may be disposed such that in a pixel located near the center of the effective pixel area the center of the micro-lens comes to the intersection of the division lines B-B and D-D, on the other hand, in the periphery of the effective pixel area the center of the micro-lens comes to a shifted position from the intersection.

As shown in FIGS. 4 through 7, the first gate electrode 67 is disposed along the division line B-B, and the second gate electrode 68 is disposed along the division line D-D. The second gate electrode 68 is formed on between the pinned photodiodes 31 and 32, and between the pinned photodiodes 33 and 34 through a thin silicon oxide layer 66. Accordingly, the second gate electrode 68 forms a gate of an MOS transistor (connection/separation transistor 51) composed of the charge storage layer 63 of the pinned photodiode 31 and the charge storage layer 63 of the pinned photodiode 32 as a source or a drain, and a gate of an MOS transistor (connection/separation transistor 52) composed of the charge storage layer 63 of the pinned photodiode 33 and the charge storage layer 63 of the pinned photodiode 34 as a source or a drain. The drive signal φPDB1 is provided to the second gate electrode 68 from a line (not shown).

Similarly, the first gate electrode 67 is formed on between the pinned photodiodes 31 and 33, and between the pinned photodiodes 32 and 34 through a thin silicon oxide layer 66. Accordingly, the first gate electrode 67 forms a gate of an MOS transistor (connection/separation transistor 53) composed of the charge storage layer 63 of the pinned photodiode 31 and the charge storage layer 63 of the pinned photodiode 33 as a source or a drain, and a gate of an MOS transistor (connection/separation transistor 54) composed of the charge storage layer 63 of the pinned photodiode 32 and the charge storage layer 63 of the pinned photodiode 34 as a source or a drain. The drive signal φPDB2 is provided to the first gate electrode 68 from a line (not shown).

At the point where the first and the second gate electrodes 67, 68 are crossed, the gate electrode of the second gate electrode 68 passes over the gate electrode 67 through an insulation layer as shown in FIG. 7.

In the present embodiment, when the second gate electrode 68 is low (φPDB2 is low), since an inversion layer does not generated in the channel area of the connection/separation transistor 51 as shown in FIG. 5, the connection/separation transistor 51 becomes off. On the other hand, when the second gate electrode 68 is high (φPDB2 is high), since an inversion layer 69 is generated in the channel area of the connection/separation transistor 51, the connection/separation transistor 51 becomes on. The similar can be applied to the other connection/separation transistors 52 through 54.

Although the connection/separation transistors 51 through 54 become off when the voltage of the gate thereof is made to become zero potential (voltage of the substrate 1), they may be made to be on when the difference to the zero potential becomes large. Moreover, although the connection/separation transistors 51 through 54 become on when the voltage of the gate thereof is made to become zero potential (voltage of the substrate 1), they may be made to be off when negative voltage than the zero potential is applied. When the connection/separation transistors 51 through 54 are constructed to be off when the gate voltage is not applied, they become on when the positive voltage applied to the gate voltage, and when the connection/separation transistors 51 through 54 are constructed to be on when the gate voltage is not applied, they become off when the negative voltage is applied to the gate voltage.

In the present embodiment, the first and the second gate electrodes 67, 68 are made from a transparent material such as an ITO film. Accordingly, incident light is not blocked by the first and the second gate electrodes 67, 68, and reaches the area between the pinned photodiodes 31 through 34 located under the first and the second gate electrodes 67, 68. Accordingly, for example, when the connection/separation transistor 51 is on as shown in FIG. 6, since an inversion layer 69 formed between the pinned photodiodes 31 and 32 has a photoelectric conversion function, using efficiency of the incident light can be enhanced. On the other hand, when the connection/separation transistor 51 is off as shown in FIG. 5, since an inversion layer 69 is not formed, the area between the pinned photodiodes 31 and 32 does not have a photoelectric conversion function. On this point, the similar can be applied to the other areas between the pinned photodiodes 31 through 34.

The first and the second gate electrodes 67, 68 may be constructed by polysilicon instead of the ITO film. In the polysilicon case, although transmittance becomes partly lower than that of ITO film, since it can easily be formed as a fine structure, from collective consideration, there are instances where polysilicon can further reduce amount of light loss.

In the present invention, although it is disadvantageous in terms of using efficiency of the incident light, the first and the second gate electrodes 67, 68 may be constructed by a light blocking material.

As is understood from the above explanation, in the present embodiment, the first and the second gate electrodes 67, 68 form a mode setting means capable of selectively setting mode such as a PD upper-and-lower bisected state (a first mode), a PD left-and-right bisected state (a second mode), and a PD undivided state (a third mode) in accordance with control signals (ϕPDB2 and ϕPDB1). In the PD upper-and-lower bisected state, signals of pinned photodiodes 31, 32 are added, and signals of pinned photodiodes 33, 34 are added, and these added signals are independently obtained. In the PD left-and-right bisected state, signals of pinned photodiodes 31, 33 are added, and signals of pinned photodiodes 32, 34 are added, and these added signals are independently obtained. In the PD undivided state, signals of pinned photodiodes 31 through 34 are added.

Even if pinned photodiodes 31 through 34 are constructed to be completely electrically separated with each other, by suitably disposing charge storage portions and transfer switches so as to independently use or add signals red out from pinned photodiodes 31 through 34 in accordance with control signal, it becomes possible to realize the similar signal adding modes such as the PD left-and-right bisected state, the PD left-and-right bisected state, and the PD undivided state, so that the present invention may include such construction. However, when pinned photodiodes 31 through 34 can be separated or connected in accordance with the control signal as shown in the present embodiment, the number of external charge storage portions and transfer switches can be reduced and wiring can be simplified, so that it is much desirable.

Moreover, between the first and a second electric charge storage portions 35, 36 and the pinned photodiodes 32, 33, gate electrodes 71, 72 are respectively formed through a thin silicon oxide film 66. The first and a second transfer transistors 37, 38 are constructed as MOS transistors whose gates are gate electrodes 71, 72, and whose source and drain are electric charge storage potions 35, 36 and pinned photodiodes 32, 33, respectively.

The gate electrodes 71, 72 are connected each other with a line not shown. Accordingly, the first and the second transfer transistors 37, 38 are on and off at the same time in accordance with drive signal ϕTGA. Therefore, respective electric charges from pinned photodiodes 32, 33 are transferred to corresponding electric charge storage portions 35, 36 at the same time.

The electric charge storage portions 35, 36 include N-type layers 73, 74 formed on the P-type well 62. The gate electrodes 71, 72 of the first and the second transfer transistor 37, 38 are disposed over upper parts of the two N-type layers 73, 74. In this manner, the electric charge storage portions 35, 36 are constructed as MOS capacitors by the gate electrodes 71, 72 and the N-type layers 73, 74.

When the gate electrodes 71, 72 are applied with low voltage, interface states of the surfaces of the electric charge storage portions 35, 36 come to the pinning potential of P-type well 62 and are filled with holes. Magnitude of a dark current is largely dependent on electron occupation probability of the interface state. Accordingly, dark currents of the electric charge storage portions 35, 36 can be drastically lowered by filling interface state with holes by applying voltage as described above to the gate electrodes 71, 72.

In FIG. 4, FD40 is constructed as substantially one floating diffusion by electrically connecting two N-type areas 75, 76 formed separately on the P-type well with a wiring 77. Electric charge is transferred from either of the two electrical charge storage portions 35 and 36 to the FD40.

Gate electrodes 78, 79 are formed through a thin silicon oxide film 66 between the first and the second electric charge storage portions 35, 36 and N-type diffusion layer as the FD40. The third and the fourth transfer transistors 41, 42 are constructed as MOS transistors making the gate electrodes 78, 79 as gates, and N-type layers 71, 72 of the electric charge storage portions 35, 36 and N-type diffusion area of the FD40 as sources or drains.

The gate electrode 78 of the third transfer transistor 41 and the gate electrode 79 of the fourth transfer transistor 42 are independently formed and supplied with independent drive signals ϕTGB and ϕTGC from the vertical scanning circuit 21. Accordingly, the third and the fourth transfer transistors 41, 42 are independently driven in accordance with respective drive signals ϕTGB and ϕTGC. Therefore, the third and the fourth transfer transistors 41, 42 can transfer electric charge from the first and the second electric charge storage portions 35, 36 either at the same time or different timings to the FD40.

Furthermore, as shown in FIG. 8, other than N-type diffusion layer 76, N-type diffusion layers 81 through 83 are formed along C-C line in FIG. 4. The N-type layer 81 is connected to a power supply VDD by unillustrated wiring. A gate electrode 84 is formed on the N-type layers 81, 82 through a thin silicon oxide film 66. The amplifying transistor 43 is constructed as an MOS transistor making the gate electrode 84 as a gate, and the N-type layers 81, 82 as a source or a drain. The gate electrode 84 is connected to the FD40 (N-type layers 75, 76) by the wiring 77.

A gate electrode 85 is formed on a space between N-type layers 82 and 83 through a thin silicon oxide film 66. The select transistor 45 is constructed as an MOS transistor making the gate electrode 85 as a gate, and N-type layers 82, 83 as a source or a drain.

A gate electrode 86 is formed on a space between N-type layers 76 and 81 through a thin silicon oxide film 66. The FD reset transistor 44 is constructed as an MOS transistor making the gate electrode 86 as a gate, and N-type layers 76, 81 as a source or a drain.

As shown in FIGS. 5 and 6, N-type layer 87 is formed in P well 62. A gate electrode 88 is formed on a space between N-type layer 87 and the pinned photodiode 31 through a thin silicon oxide film 66. PD reset transistor 46 is constructed as an MOS transistor making the gate electrode 88 as a gate, and N-type layer 87 and the electric charge storage layer 63 of the pinned photodiode 31 as a source or a drain. Drive signal φPDR is supplied to the gate electrode 88 by an unillustrated wiring.

A second reset portion (here, PD reset transistor 46) discharges unnecessary electric charge in the pinned photodiodes 31 through 34. In the unnecessary electric charge, there are reset electric charge upon operating electric shutter and overflowed electric charge upon receiving strong incident light. In either case, unnecessary electric charge may be transferred to the FD 40 and discharged by the first reset portion (here, FD reset transistor 44). When performing in this manner, the second reset portion is not necessary to be disposed.

Moreover, thick silicon oxide film 70 is formed on the circumference of the pinned photodiodes 31 through 34 and each N-type layer, and each element is separated.

Then, an example of timing for reading out signals from the solid-state imaging device 3 is explained with reference to FIGS. 9 through 11.

Figure 9:
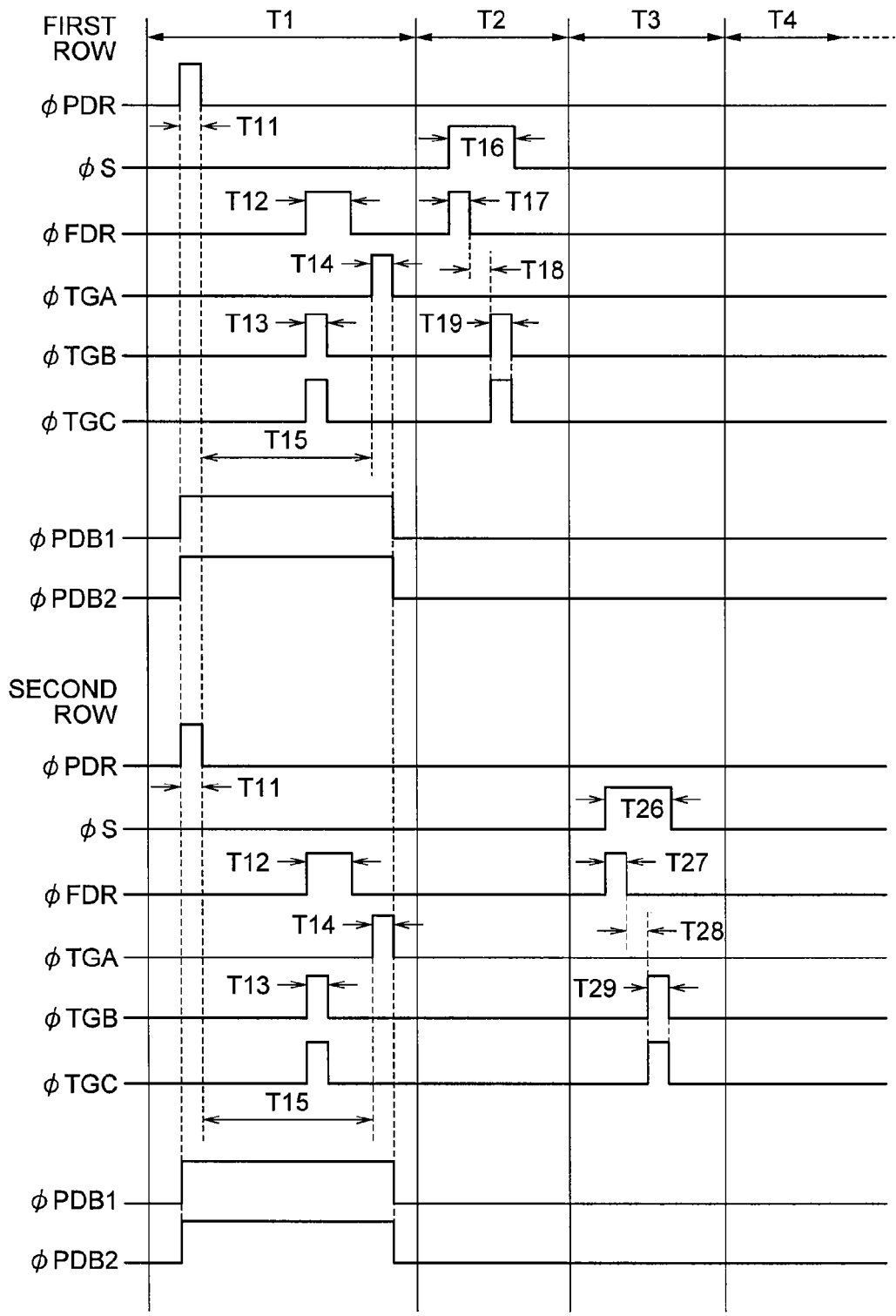
FIG. 9 is a timing chart showing a movement state of the solid-state imaging device shown in FIG. 1.

FIG. 9 is a timing chart showing drive signals (in other words, drive signals for reading out signals from pixels exposed in a PD undivided state) for reading out imaging signal. FIG. 10 is a timing chart showing drive signals for reading out focal point detection signal from pixels exposed in a PD left-and-right bisected state. FIG. 11 is a timing chart showing drive signals for reading out focal point detection signal from pixels exposed in a PD upper-and-lower bisected state.

As for vertical scanning, a signal line is selected every one horizontal row, and moved successively to the next row. In each selected row, movement shown in FIGS. 9 through 11 is carried out, and drive signals shown in figures are output. The scanning is repeated over entire image field in vertical direction. When the scanning has been completed at the bottom row, select movement is returned to the top row after a vertical returning period has elapsed. FIGS. 9 through 11 only shows drive signals in the first and the second rows.

At first, an example of movement for reading out imaging signal is explained with reference to FIGS. 9, 2, and 3. In this movement, all pixels 20 basically become a PD undivided state upon exposure. In this movement, all pixels are exposed at the same time.

In FIG. 9, a period T1 is a period when all effective pixels are driven at the same time. In other words, regarding drive pulse in the period T1, the same drive signals are output in all rows. The period T2 is a period for reading out the first row, the period T3 is a period for reading out the second row, the period T4 is a period for reading out the third row, and the drive signal shown in the figure is output only to the selected row. The same holds for FIGS. 10 and 11 explained later.

At first, in the period from the starting point of period T11 to the ending point of period T14, all effective pixels become the PD undivided state by making φPDB1 and φPDB2 high. Accordingly, the pinned photodiodes 31 through 34 as a whole become substantially equivalent to an undivided photoelectric converter. In this period, movements of the periods T11 through T14 explained later are carried out.

At first, in the period T11, φPDR is made high, so that the PD reset transistor 46 becomes on. With this movement, unnecessary electric charge stored in all effective pixels in the pinned photodiodes 31 through 34 is discharged to the electric power supply VDD. In other words, the pinned photodiodes 31 through 34 are reset. The pinned photodiodes 31 through 34 in all effective pixels start exposure at the time the period T11 is finished. On this occasion, in the present embodiment, photoelectric conversion of incident light is performed in the area of the pinned photodiodes 31 through 34 as described above.

In the period T12, φFDR is made high, so that the FD reset transistor 44 becomes on. At the same time, in the period T13, φTGB and φTGC are made high, so that the third and the fourth transfer transistors 41, 42 become on at the same time. With this movement, electric charge stored in the FD 40 and the first and the second electric charge storage portions 35, 36 is discharged to the electric power supply VDD. In other words, FD 40 and the electric charge storage portions 35, 36 in the all effective pixels are reset.

In the period T14, φTGA is made high, so that the first and the second transfer transistors 37, 38 become on. All electric charge stored in the connected pinned photodiodes 31 through 34 and spaces between them in all effective pixels are transferred to the first and the second electric charge storage portions 35, 36 separately. In the period T14, only one of the first and the second transfer transistors 37, 38 may be on. Here, the period T15 (the period from the time φPDR is made low to the time φTGA is made on) shown in FIG. 9 becomes exposure time. Exposure time T15 is the same period and the same timing for all effective pixels. Accordingly, all effective pixels can obtain imaging information without making mistakes in the timing.

Then, in the period T16, φS in the first row is made high, so that the selection transistor 45 becomes on. Accordingly, pixels in the first row are selected, and signals from the pixels in the first row are output to the vertical signal line 25.

At the same time, in the period T17, φFDR in the first row is made high, so that the FD reset transistor 44 becomes on. With this movement, the FD 40 is reset. At the end of the period T17, in other words, the period (period T18) from the time φFDR is made low to the time the period T19 starts, output of the amplifying transistor 43 of the first row upon resetting FD 40 is stored in the CDS circuit 27 through the vertical signal line 25.

In the period T19, φTGB and φTGC are made high, so that the third and the fourth transfer transistors 41, 42 are on at the same time. Accordingly, electric charge stored in the electric charge storage portions 35, 36 disposed two in each pixel are combined and transferred together to the FD 40. Electric potential amplified in accordance with the electric charge stored in the FD 40 is transferred to the CDS circuit 27 through the vertical signal line 25. In the CDS circuit 27, difference from the previously stored output upon reset is output as the image signal of the first row. Then, the image signal of the first row is output by the drive signal of the horizontal scanning circuit 22 through the horizontal signal line 28 and the output amplifier 29.

Likewise, in the period T3, the second row is red cut. The drive signal is the same as the first row. The periods T26 through T29 in FIG. 9 are corresponding to the periods T16 through T19.

Incidentally, φPDR may be always high after completion of reading out (after φS is off).

As understood from the explanation above, since each pixel makes φPDB1, φPDB2 high, and combines four pinned photodiodes 31 through 34 in the period from the start of the period T11 to the end of the period T14, image signal can be output as usual. Moreover, since gate electrodes 67, 68 disposed along the division lines B-B, D-D transmits incident light, using efficiency of the incident light enhances and sensitivity can be improved. Moreover, it is obvious from the explanation above that an electronic shutter capable of making exposure timing of all pixels the same is possible. There is no doubt that the movement of a rolling shutter for resetting every row is also possible.

Moreover, since all pixels have the same configuration in the above-described solid-state imaging device 3, it becomes unnecessary to make correction on a portion of pixels upon reading out image signal. When a pixel for detecting focal point and a pixel for imaging are different configuration, it becomes necessary to make correction on a portion of pixels upon reading out image signal.

An example of movement for reading out focal point detection signal exposed in a PD left-and-right bisected state is explained with reference to FIGS. 10, 2, and 3. In this movement, all pixels 20 basically become in a PD left-and-right bisected state upon exposure. In this movement, all pixels are exposed at the same time.

This movement is carried out when desired row of pixels standing in a line in the left-and-right direction are used as a focal point detection line sensor to obtain focal point detection signal. In an example of movement shown in FIG. 10, a left-half signal (in the present embodiment, the signal photoelectrically converted from the area between pinned photodiodes 31 and 33 is added) and a right-half signal (in the present embodiment, the signal photoelectrically converted from the area between pinned photodiodes 32 and 34 is added) of all effective pixels exposed in the PD left-and-right bisected state are red out. The signal of all pixels red out in this manner is temporally stored in the memory 7 shown in FIG. 1, and then upon carrying out focal point detection processing at the focal point calculator, signals regarding only desired row of pixels are selectively used from the memory 7. In the example of movement shown in FIG. 10, although focal point detection signal is obtained by reading out all pixels, pixels other than desired row of pixels may be thinned out and not necessary to be red out.

At first, in the period T31, φPDR is made to be high, so that PD reset transistor 46 becomes on, and φPDB1 and φPDB2 are made to be high, so that it becomes PD undivided state. With this movement, unnecessary electric charge stored in pinned photodiodes 31 through 34 of all effective pixels is discharged to the power supply VDD. In other words, the pinned photodiodes 31 through 34 are reset. The pinned photodiodes 31 through 34 of all effective pixels starts exposure at the end of the period T31. At this time, in the present embodiment, photoelectric conversion of the incident light is carried out even on the area between the pinned photodiodes 31 through 34 as described above.

Although φPDB1 is made to be low after termination of the period T31, even after terminating the period T31 φPDB2 is kept high until termination of the period T34. Accordingly, in the period after termination of the period T31 until termination of the period T34 all effective pixels become the PD left-and-right bisected state and the pinned photodiodes 31 through 34 of each pixel as a whole become substantially equivalent to a left-and-right bisected (bisected to a left portion and a right portion) photoelectric converter portion. In this period, movements according to the period T32 through T34 explained below are carried out.

In the period T32, φFDR is made to be high, so that the FD reset transistor 44 becomes on. At the same time, in the period T33, φTGB and φTGC are made to be high, so that the third and the fourth transfer transistor 41, 42 become on at the same time. With this movement, electric charge stored in the FD40, the first and the second electric charge storage portions 35, 36 are discharged to the power supply VDD. In other words, the FD40 and electric charge storage portions 35, 36 of all effective pixels are reset.

In the period T34, φTGA is made to be high, so that the first and the second transfer transistors 37, 38 become on. As a result, electric charge stored in the pinned photodiodes 32 and 34 of the right side of all effective pixels are transferred to the first electric charge storage portion 35 through the first transfer transistor 37. On the other hand, electric charge stored in the pinned photodiodes 31 and 33 of the left side of all effective pixels are transferred to the second electric charge storage portion 36 through the second transfer transistor 38. Here, the period T35 (the period from making φPDR low to making φTGA on) shown in FIG. 10 is the exposure period. The exposure period T35 is the same period and the same timing for all effective pixels. Accordingly, all effective pixels can obtain focal point detection information without shifting timing. The movements of the period so far (period T1) is the same as the movements for obtaining image signal explained with reference to FIG. 9 except exposure is carried out in the PD left-and-right bisected state.

Then, in the period T36, φS of the first row is made to be high, so that the select transistor 45 becomes on. Accordingly, pixels of the first row are selected, and signals are output from pixels of the first row to the vertical signal line 25.

At the same time, in the period T37, φFDR of the first row is made to be high, and the FD reset transistor 44 is on. With this movement, FD40 is reset. At the end of the period T37, in other words, during the period (period T38) after φFDR becomes low to the start of the period T39, the output from the amplifying transistor 43 of the first row upon resetting the FD40 is stored in the CDS circuit 27 through the vertical signal line 25.

In the period T39, φTGB is made to be high, so that the third transfer transistor 41 becomes on. Accordingly, electric charge stored in the first electric charge storage portion 35 is transferred to the FD40. Potential amplified in accordance with the amount of electric charge is transferred to the CDS circuit 27 through the vertical signal line 25. In the CDS circuit 27, the difference from the previously stored output upon resetting FD40 is output as a pupil signal output of one of the left-and-right direction of the pixels in the first row. These pupil signal output of one of the left-and-right direction of the pixels in the first row is output by the drive signal of the horizontal scanning circuit 22 through the horizontal signal line 28 and the output amplifier 29.

Then, in the period T40, φFDR of the first row is made to be high, and the FD reset transistor 44 is on. With this movement, FD40 is reset. At the end of the period T40, in other words, during the period (period T41) after φFDR becomes low to the start of the period T42, the output from the amplifying transistor 43 of the first row upon resetting the FD40 is stored in the CDS circuit 27 through the vertical signal line 25.

In the period T42, φTGC is made to be high, so that the fourth transfer transistor 42 becomes on. Accordingly, electric charge stored in the second electric charge storage portion 36 is transferred to the FD40. Potential amplified in accordance with the amount of electric charge is transferred to the CDS circuit 27 through the vertical signal line 25. In the CDS circuit 27, the difference from the previously stored output upon resetting is output as a pupil signal output of the other of the left-and-right direction of the pixels in the first row. These pupil signal output of the other of the left-and-right direction of the pixels in the first row is output by the drive signal of the horizontal scanning circuit 22 through the horizontal signal line 28 and the output amplifier 29.

With these movement, pupil signal output of one of the left-and-right direction and pupil signal output of the other of the left-and-right direction of the pixels in the first row can be obtained.

Similarly the following rows are red out. Drive signal is the same as the first row. The periods T46 through T52 in FIG. 10 correspond to the periods T36 through T42.

After completion of readout (after φS is off) φPDR may be always high. As is understood from the above explanation, since each pixel becomes in the PD left-and-right bisected state by making φPDB1 low and making φPDB2 high in the period from the completion of the period T31 to the completion of the period T34, pupil signal output of one side in the left-and-right direction and pupil signal output of the other side in the left-and-right direction of each pixel can be obtained. Moreover, since gate electrodes 67, 68 disposed along the division lines B-B, D-D transmit incident light, using efficiency of the incident light increases, and sensitivity of the focal point detection signal can be increased. Furthermore, it is obvious from the above explanation that upon obtaining focal point detection signal, an electronic shutter whose exposure timing is the same over entire effective pixels can be available.

Then, an example of movement for reading out focal point detection signal exposed in a PD upper-and-lower bisected state is explained with reference to FIGS. 11, 2, and 3. In this movement, all pixels 20 basically become in a PD upper-and-lower bisected state upon exposure. In this movement, all pixels are exposed at the same time.

This movement is carried out when desired column of pixels standing in a line in the upper-and-lower direction are used as a focal point detection line sensor to obtain focal point detection signal. In an example of movement shown in FIG. 11, an upper-half signal (in the present embodiment, the signal photoelectrically converted from the area between pinned photodiodes 31 and 32 is added) and a lower-half signal (in the present embodiment, the signal photoelectrically converted from the area between pinned photodiodes 33 and 34 is added) of all effective pixels exposed in the PD upper-and-lower bisected state are red out. The signal of all pixels red out in this manner is temporally stored in the memory 7 shown in FIG. 1, and then upon carrying out focal point detection processing at the focal point calculator, signals regarding only desired column of pixels are selectively used from the memory 7. In the example of movement shown in FIG. 11, although focal point detection signal is obtained by reading out all pixels, pixels other than desired column of pixels are not necessary to be red out, or may be thinned out.

Figure 10:
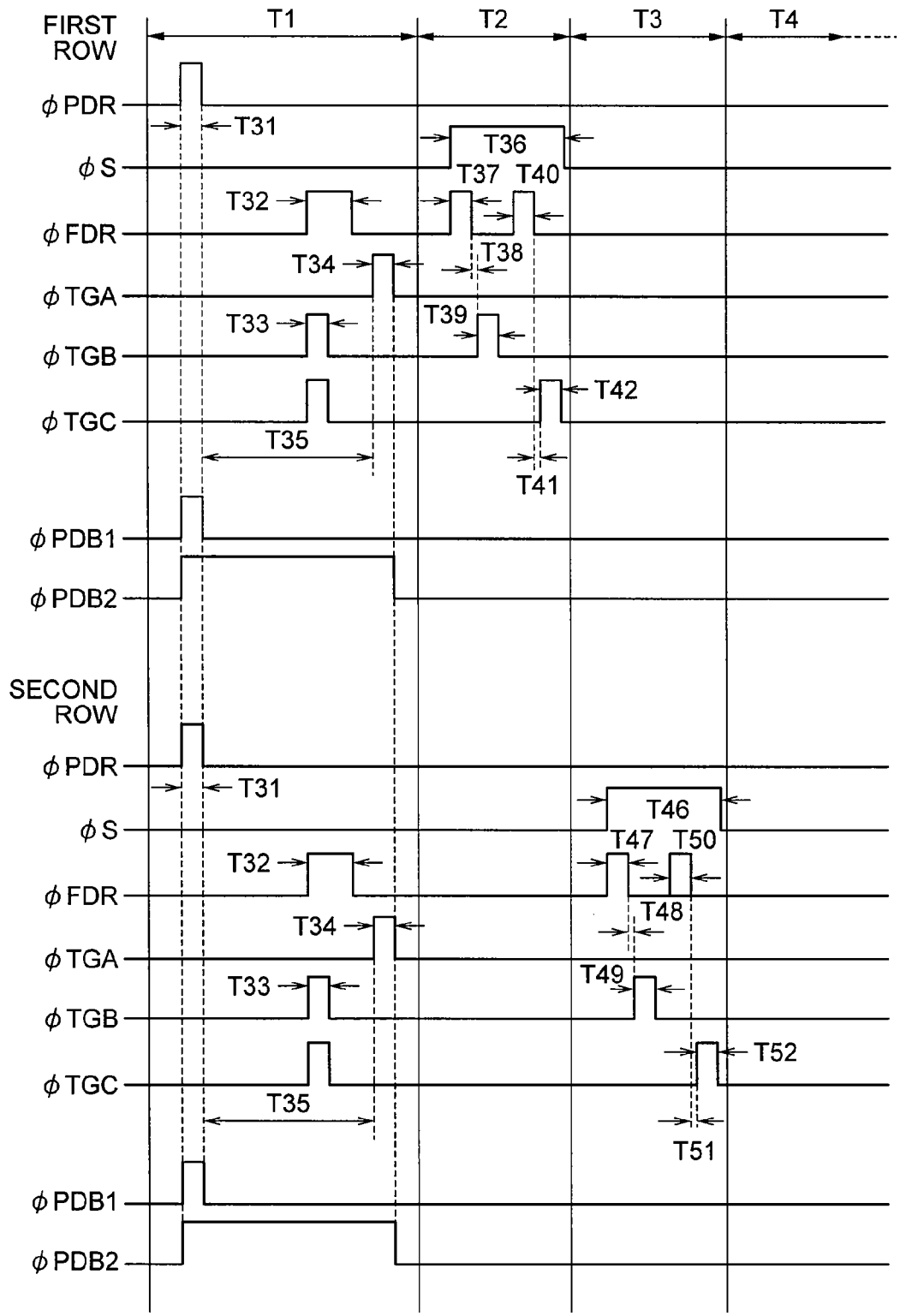
FIG. 10 is a timing chart showing another movement state of the solid-state imaging device shown in FIG. 1.
Figure 11:
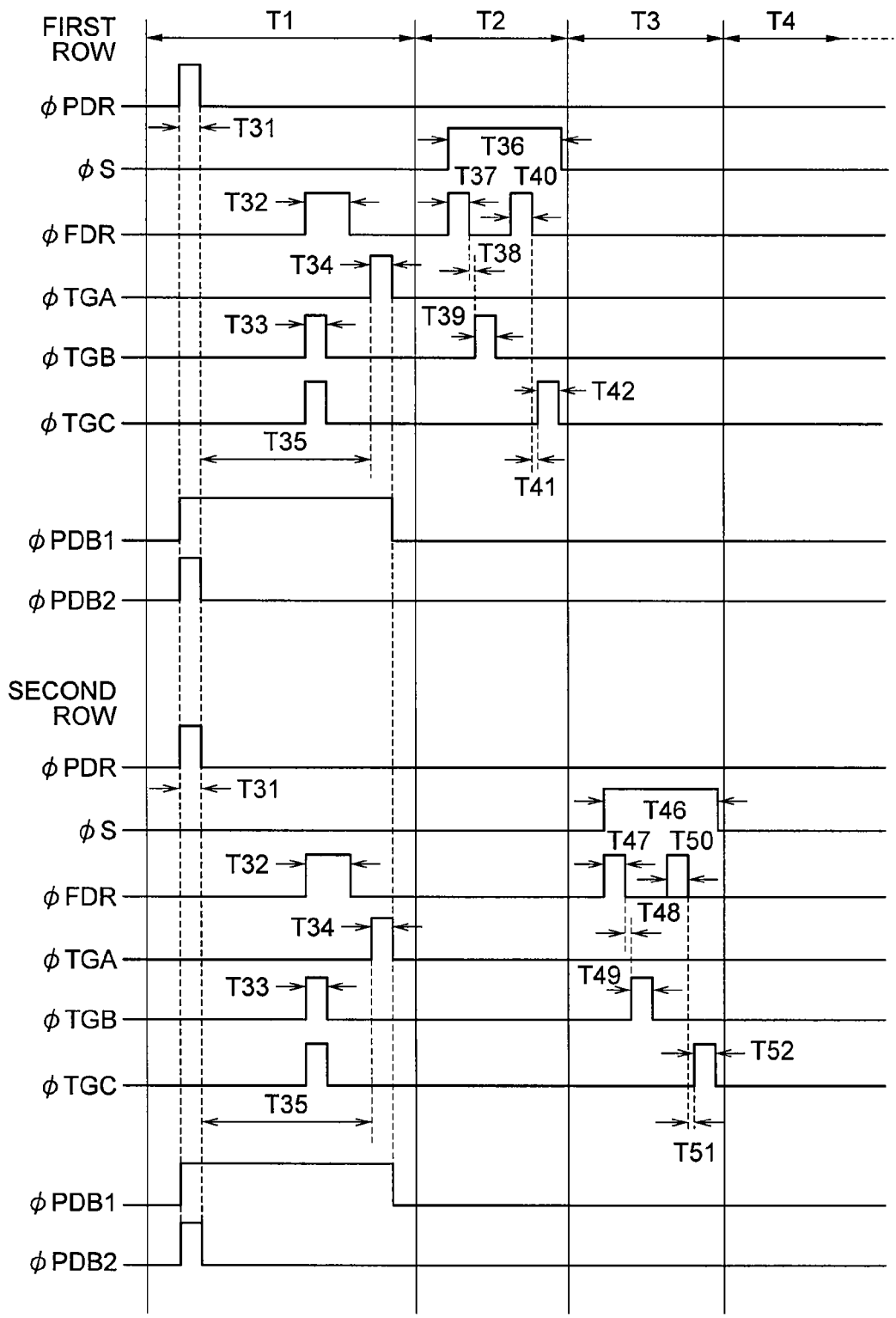
FIG. 11 is a timing chart showing still another movement state of the solid-state imaging device shown in FIG. 1.

The movement shown in FIG. 11 is basically similar to the afore-mentioned movement shown in FIG. 10. The point of difference is that φPDB1 is interchanged with φPDB2. In other words, in the movement shown in FIG. 11, φPDB1 is on in the period from the start of the period T31 to the end of the period T34, and φPDB2 is on only in the period T31.

Accordingly, in the movement shown in FIG. 11, since each pixel becomes in the PD upper-and-lower bisected state during the period from at the end of the period T31 to the end of the period T34 by making φPDB1 high and φPDB2 low, pupil signal output of one side in the upper-and-lower direction and pupil signal output of the other side in the upper-and-lower direction of each pixel can be obtained. Moreover, since gate electrodes 67, 68 disposed along the division lines B-B, D-D transmit incident light, using efficiency of the incident light increases, and sensitivity of the focal point detection signal can be increased. Furthermore, it is obvious from the above explanation that upon obtaining focal point detection signal, an electronic shutter whose exposure timing is the same over entire effective pixels can be available.

As is understood from the above-described explanation, in the aforementioned solid-state imaging device 3, by carrying our movements shown in FIG. 10, focal point detection signal (pupil signal output of one side in the left-and-right direction and pupil signal output of the other side in the left-and-right direction) for detecting phase shift in the left-and-right direction can be obtained from any desired pixel line standing in line left-and-right direction. Moreover, in the aforementioned solid-state imaging device 3, by carrying out movements shown in FIG. 11, focal point detection signal (pupil signal output of one side in the upper-and-lower direction and pupil signal output of the other side in the upper-and-lower direction) for detecting phase shift in the upper-and-lower direction can be obtained from any desired pixel line standing in line upper-and-lower direction.

Accordingly, the aforementioned solid-state imaging device 3 does not cause an effect something like a defect pixel, but is able to freely change whether which pixel functions as a pixel having a photoelectric converter portion bisected in which direction, so that it becomes possible to obtain an advantage that accuracy of focal point detection can be increased.

In a pupil division phase difference detection method, in order to detect focal point at the center, upper part, or lower part of the image frame, it is said to be necessary to dispose left-and-right bisected photodiodes in the vertical direction (upper-and-lower direction) in a line sensor shape, and in order to detect focal point at the center, left part, or right part of the image frame, it is said to be necessary to dispose upper-and-lower bisected photodiodes in the horizontal direction (left-and-right direction) in a line sensor shape. The aforementioned solid-state imaging device 3 can carry out focal point detection in the horizontal direction (left-and-right direction) as well as in the vertical direction (upper-and-lower direction) despite of the same pixel configuration.

Figure 12:
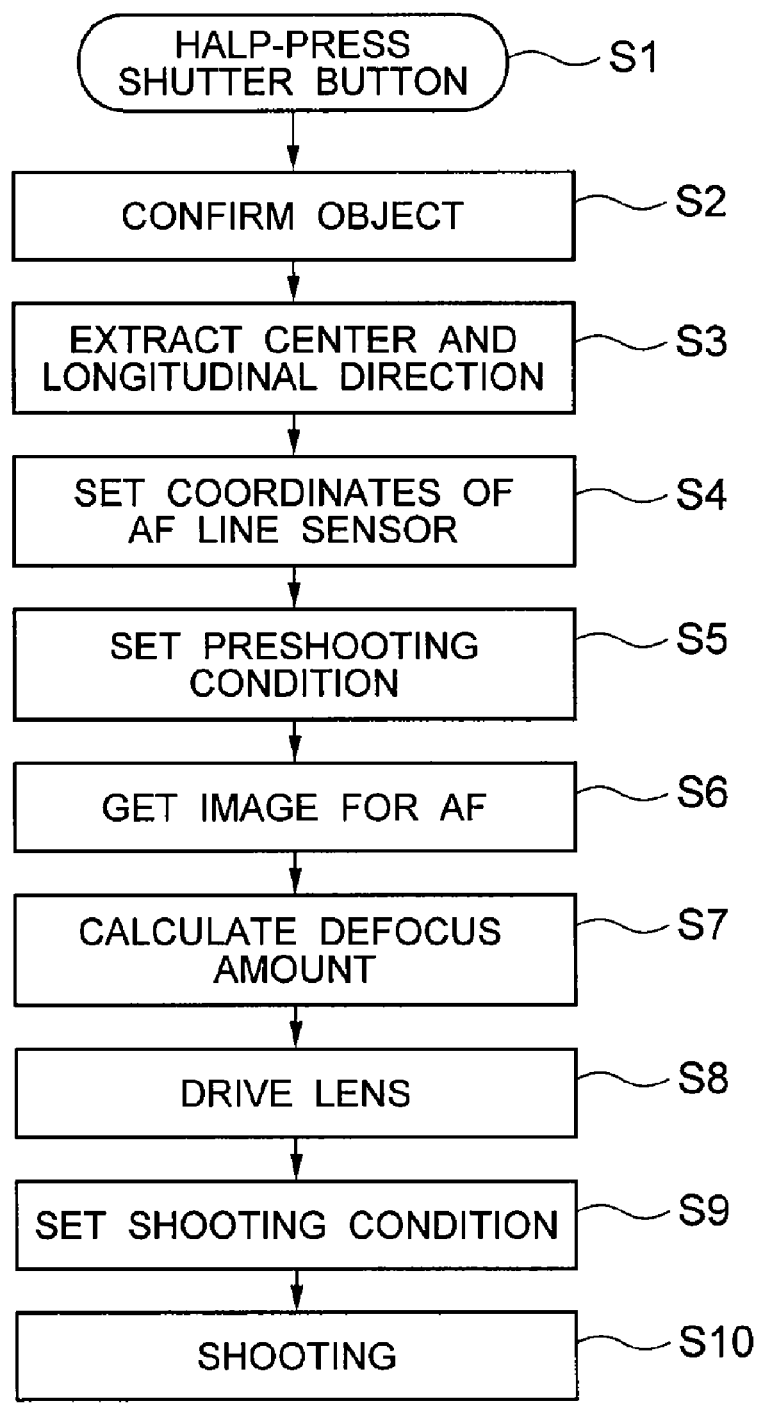
FIG. 12 is a flow chart showing a movement example of the electric still camera shown in FIG. 1.

Then, an example of movement of an electronic camera 1 according to the present embodiment is explained with reference to FIGS. 1 and 12.

When a release button in the operating portion 9*a* is half-pressed (Step S1), the microprocessor 9 in the electronic camera 1 drives the imaging controller 4 corresponding to the half-press operation. In order to confirm an object, the imaging controller 4 reads out imaging signal for confirming object from all pixels or given pixels by a given well-known method, and stores in the memory 7. In this case, when all pixels are to be red out, for example, the same movements shown in FIG. 9 are carried out. The image processor confirms object by using image confirming technique from the signal (Step S2). For example, in a face confirming mode, a face as an object is confirmed. The image processor 13 picks up central coordinates and a longitudinal direction of the object (Step S3).

Then, the microprocessor 9 sets coordinates of pixel line (position and longitudinal direction) corresponding to a line sensor for auto focus optimum for precision detection of focusing state to the object on the basis of the center coordinates and longitudinal direction picked up in step S3 (Step S4). Microprocessor 9 sets shooting condition (aperture stop, focusing state, shutter speed, and the like) for focal point detection on the basis of confirmation results in step S2 (Step S5).

The microprocessor 9 successively moves the lens controller 2*a* to become the conditions such as aperture stop set by the step S5, and drives the imaging controller 4 to become shutter speed condition set by the step S5 and pixel line coordinates set by the step S4, and reads out auto focus signal to store the memory 7 (Step S6). At this time, when the pixel line set in the step S4 is a pixel line standing in line of left-and-right direction, image signal for auto focus is red out by the movements shown in FIG. 10. On the other hand, when the pixel line set in the step S4 is a pixel line standing in line of upper-and-lower direction, image signal for auto focus is red out by the movements shown in FIG. 11.

Then, the microprocessor 9 picks up signals of each pixel in the pixel line of coordinates set in the step S4 among signals of all pixels stored in the memory 7 obtained in the step S6, makes the focal point calculator 10 calculate in accordance with the pupil division phase difference detection method on the basis of these signals to obtain an amount of defocus (Step S7).

Then, the microprocessor 9 makes the lens controller 2a adjust the image-taking lens 2 to come to focus state in accordance with the amount of defocus calculated in step S7. The microprocessor 9 successively set shooting condition (aperture stop, shutter speed, and the like) for shooting.

Then, the microprocessor 9 makes the lens controller 2a set the aperture stop an the like to become the condition set in the step S9, and in synchronization with a full-press of the release button in the operating portion 9a drives the imaging controller 4 with the shutter time condition, and the like set in the step S9, so that shooting is carried out by reading out image signal (Step S10). At this time, image signal is red out by the aforementioned movement shown in FIG. 9. The image signal is stored in the memory 7 by the imaging controller 4.

After that, the microprocessor 9, if required, performs required processing in the image processor 13 or the image compressor 12 on the basis of an instruction of the operating portion 9a, and makes the recorder output the processed signal to store in the recording medium 11a.

In the electronic camera 1 according to the present embodiment, since auto focus is carried out by detecting focusing state on the basis of the signal of the pixel line at the optimized position in accordance with the object, it becomes possible to carry out auto focus with high precision.

Although an embodiment of the present invention is explained above, the present invention is not limited to the embodiment.

For example, in a CMOS type image sensor, various kinds of pixel structure have been known. The present invention can apply to those image sensors. Moreover, the present invention can apply to various image sensors other than the CMOS type image sensor.

Furthermore, in the present embodiment, although the connection/separation transistors 51 through 54 are MOS transistors, those may be, for example, junction-field-effect-transistors (J-FET).

What is claimed is:

1. A solid-state imaging device for photoelectrically converting an object image formed by an image-taking lens comprising:
    a plurality of pixels disposed two-dimensionally;
    at least one pixel among the plurality of pixels including four photoelectric converter portions each of which exists in one of four areas divided by a first line extending in a first direction and a second line extending in a second direction crossing with each other in plan view and carries out photoelectric conversion, and a mode setting member capable of selectively setting each of a first mode through a third mode in accordance with a control signal;
    the first mode being a mode that two photoelectric converter portions located to one side of the first line among the four photoelectric converter portions are electrically connected, and two photoelectric converter portions located to the other side of the first line among the four photoelectric converter portions are electrically connected, and photoelectric converter portions located to different sides with respect to the first line among the four photoelectric converter portions are electrically separated;
    the second mode being a mode that two photoelectric converter portions located to one side of the second line among the four photoelectric converter portions are electrically connected, and two photoelectric converter portions located to the other side of the second line among the four photoelectric converter portions are electrically connected, and photoelectric converter portions located to different sides with respect to the second line among the four photoelectric converter portions are electrically separated;
    the third mode being a mode that two photoelectric converter portions located to one side of the first line among the four photoelectric converter portions are electrically connected with each other, and two photoelectric converter portions located to the other side of the first line among the four photoelectric converter portions are electrically connected with each other, and two photoelectric converter portions located to one side of the second line among the four photoelectric converter portions are electrically connected with each other, and two photoelectric converter portions located to the other side of the second line among the four photoelectric converter portions are electrically connected with each other,
    wherein each area of the solid-state imaging device located between the two neighboring photoelectric converter portions with the first or the second line being located in between has a photoelectric converter function when said neighboring two electric converter portions are electrically connected, and does not have a photoelectric converter function when said neighboring two electric converter portions are electrically separated.

2. The solid-state imaging device according to claim 1, wherein the mode setting member includes a first gate electrode disposed along the first dividing line and a second gate electrode disposed along the second dividing line.

3. The solid-state imaging device according to claim 2, wherein the first gate electrode constitutes a gate of a MOS transistor setting semiconductor areas of the two photoelectric converter portions located to one side of the second dividing line among the four photoelectric converter portions to be source or drain, and a gate of an MOS transistor setting semiconductor areas of the two photoelectric converter portions located to the other side of the second dividing line among the four photoelectric converter portions to be source or drain, and
    the second gate electrode constitutes a gate of a MOS transistor setting semiconductor areas of the two photoelectric converter portions located to one side of the first dividing line among the four photoelectric converter portions to be source or drain, and a gate of an MOS transistor setting semiconductor areas of the two photoelectric converter portions located to the other side of the first dividing line among the four photoelectric converter portions to be source or drain.

4. The solid-state imaging device according to claim 3, wherein the first and the second gate electrodes are constructed by polysilicon.

5. The solid-state imaging device according to claim 2, wherein the first and the second gate electrodes are constructed by a transparent material.

6. The solid-state imaging device according to claim 1, wherein each of the at least one pixel includes
- a first electric charge storage portion and a second electric charge storage portion for storing respective electric charges transferred from two photoelectric converter portions located diagonally among the four photoelectric converter portions,
- a charge accumulating portion that receives selectively electric charges from said first and second storage portions,
- an amplifier for outputting a signal in accordance with an electric charge amount of said charge accumulating portion,
- a first transfer gate for transferring electric charge from one of said two diagonally located photoelectric converter portions to the first electric charge storage portion,
- a second transfer gate for transferring electric charge from the other of said two diagonally located to the second electric charge storage portion,
- a third transfer gate for transferring electric charge from the first electric charge storage portion to the charge accumulating portion, and
- a fourth transfer gate for transferring electric charge from the second electric charge storage portion to the charge accumulating portion.

7. An imaging apparatus including the solid-state imaging device according to claim 1, and a signal processor for outputting a detection signal indicating a focusing state of the image-taking lens based on signals obtained in the first mode or the second mode from each selected pixel among the at least one pixel.

8. The imaging apparatus according to claim 7, wherein on which mode, among the first and the second modes, detection of the focusing state of the image-taking lens is based is determined in accordance with the object image.

9. The imaging apparatus according to claim 7, wherein a lens controller for controlling focus adjustment of the image-taking lens based on of the detection signal from the signal processor is included.

* * * * *